(12) United States Patent
Jang et al.

(10) Patent No.: US 10,662,525 B2
(45) Date of Patent: May 26, 2020

(54) THIN FILM DEPOSITION APPARATUS

(71) Applicant: ASM IP Holding B.V., Almere (NL)

(72) Inventors: Hyun Soo Jang, Daejeon (KR); Dae Youn Kim, Daejeon (KR); Jeong Ho Lee, Seoul (KR); Young Hoon Kim, Cheonan-si (KR); Seung Seob Lee, Seoul (KR); Woo Chan Kim, Daejeon (KR)

(73) Assignee: ASM IP Holding B.V., Almere (NL)

( * ) Notice: Subject to any disclaimer, the term of this patent is extended or adjusted under 35 U.S.C. 154(b) by 519 days.

(21) Appl. No.: 15/202,468

(22) Filed: Jul. 5, 2016

(65) Prior Publication Data

US 2017/0009347 A1    Jan. 12, 2017

(30) Foreign Application Priority Data

Jul. 7, 2015    (KR) .................. 10-2015-0096795

(51) Int. Cl.
*C23C 16/455*    (2006.01)
*C23C 16/44*    (2006.01)
(Continued)

(52) U.S. Cl.
CPC .... *C23C 16/4412* (2013.01); *C23C 16/45508* (2013.01); *C23C 16/45536* (2013.01);
(Continued)

(58) Field of Classification Search
CPC ........ C23C 16/45565; C23C 16/45574; C23C 16/45563; C23C 16/45508; C23C 16/45536; H01L 21/67017
See application file for complete search history.

(56) References Cited

U.S. PATENT DOCUMENTS 5,680,013 A * 10/1997 Dornfest ........... H01J 37/32495
118/723 E
6,300,255 B1 * 10/2001 Venkataranan ....... C23C 16/455
438/787
(Continued)

FOREIGN PATENT DOCUMENTS

CN    1468975 A    1/2004
CN    102903592 A    1/2013
(Continued)

OTHER PUBLICATIONS

First Office Action dated Mar. 26, 2018 in related Chinese Patent Application No. 201610523486.6.
(Continued)

*Primary Examiner* — Matthew J Song
(74) *Attorney, Agent, or Firm* — Knobbe, Martens, Olson & Bear, LLP (57) ABSTRACT

A reaction chamber includes a reactor wall, a susceptor contacting the reactor wall to define a reaction space and a gas flow control device and a showerhead member stacked between the reactor wall and the susceptor. The showerhead member includes a gas channel and a showerhead. Penetration holes are formed through a protruding lateral portion of the gas flow control device, and the reactor wall and a lateral portion of the showerhead member are spaced apart from each other to form a gas discharge path. Gas remaining in the gas discharge path is discharged through the penetration holes and a gas outlet formed in an upper portion of the reactor wall. The reaction chamber provides a reaction space and the gas discharge path from which unnecessary regions are removed to rapidly change gases from one to another, and thus atomic layer deposition may be performed with high efficiency and productivity.

18 Claims, 10 Drawing Sheets

(51) Int. Cl.
*C23C 16/509* (2006.01)
*H01L 21/67* (2006.01)
(52) U.S. Cl.
CPC .. *C23C 16/45563* (2013.01); *C23C 16/45565* (2013.01); *C23C 16/45574* (2013.01); *C23C 16/509* (2013.01); *H01L 21/67017* (2013.01)

(56) References Cited

U.S. PATENT DOCUMENTS

| | | | | |
|---|---|---|---|---|
| 6,415,736 | B1* | 7/2002 | Hao | H01L 21/67017 |
| | | | | 118/723 E |
| 6,586,343 | B1* | 7/2003 | Ho | H01L 21/67017 |
| | | | | 118/719 |
| 7,017,514 | B1* | 3/2006 | Shepherd, Jr. | C23C 16/452 |
| | | | | 118/723 ME |
| 7,105,059 | B2 | 9/2006 | Lee et al. | |
| 9,269,564 | B2 | 2/2016 | Han et al. | |
| 2001/0042799 | A1* | 11/2001 | Kim | C23C 16/452 |
| | | | | 239/553 |
| 2005/0011447 | A1* | 1/2005 | Fink | C23C 16/45565 |
| | | | | 118/715 |
| 2005/0223986 | A1 | 10/2005 | Choi et al. | |
| 2005/0263072 | A1* | 12/2005 | Balasubramanian | |
| | | | | C23C 16/4405 |
| | | | | 118/715 |
| 2006/0090700 | A1* | 5/2006 | Satoh | C23C 16/4405 |
| | | | | 118/715 |
| 2006/0137608 | A1 | 6/2006 | Choi et al. | |
| 2008/0092815 | A1* | 4/2008 | Chen | C23C 16/45565 |
| | | | | 118/715 |
| 2010/0272895 | A1* | 10/2010 | Tsuda | C23C 16/409 |
| | | | | 427/255.32 |
| 2013/0025787 | A1* | 1/2013 | Yang | H01J 37/32633 |
| | | | | 156/345.29 |
| 2014/0235069 | A1* | 8/2014 | Breiling | F28F 3/02 |
| | | | | 438/778 |
| 2014/0299681 | A1* | 10/2014 | Kashyap | C23C 16/45525 |
| | | | | 239/553.5 |
| 2016/0042925 | A1* | 2/2016 | Yang | H01J 37/3244 |
| | | | | 156/345.33 |
| 2016/0053374 | A1 | 2/2016 | Hwang et al. | |

FOREIGN PATENT DOCUMENTS

| | | |
|---|---|---|
| CN | 103194737 A | 7/2013 |
| CN | 103225072 A | 7/2013 |
| CN | 104046960 A | 9/2014 |
| CN | 104746047 A | 7/2015 |
| KR | 10-2006-0100961 A | 9/2006 |
| TW | 201445003 A | 12/2014 |

OTHER PUBLICATIONS

Office Action dated Sep. 14, 2017 in related Taiwanese Application No. 105119292.

Second Office Action dated Nov. 14, 2018 in related Chinese Application No. 201610523486.6.

* cited by examiner

THIN FILM DEPOSITION APPARATUS

CROSS-REFERENCE TO RELATED APPLICATION

This application claims the benefit of Korean Patent Application No. 10-2015-0096795, filed on Jul. 7, 2015, in the Korean Intellectual Property Office, the disclosure of which is incorporated herein in its entirety by reference.

BACKGROUND

1. Field

One or more embodiments relate to a gas flow control device, a showerhead assembly including the gas flow control device, and a semiconductor manufacturing apparatus (such as a thin film deposition apparatus) including the showerhead assembly.

2. Description of the Related Art

One or more exemplary embodiments relate to a semiconductor manufacturing apparatus (such as a deposition apparatus), and more particularly, to a reaction chamber in which chemical reactions occur.

A reaction chamber of deposition apparatus provides a space in which chemical reactions occur, and various reaction chambers have been developed. Examples of such reaction chambers include a showerhead-type reaction chamber in which reaction gas is supplied in a direction perpendicular to a substrate, and a side flow-type reaction chamber in which reaction gas is supplied in a direction parallel to a substrate. In the showerhead-type reaction chamber, reaction gas is uniformly supplied to a reactor in a center-to-edge direction, and thus a relatively uniform thin film is formed. The side flow-type reaction chamber has a relatively simple structure, thereby enabling rapid switching between reaction gases and making it possible to reduce a reaction space.

SUMMARY

One or more embodiments include a reaction chamber, for example, a showerhead-type reaction chamber including a showerhead and an auxiliary device. The reaction chamber provides a reaction space optimally reduced in size for atomic layer deposition, and exhaust gas is rapidly discharged from the reaction chamber.

Additional aspects will be set forth in part in the description which follows and, in part, will be apparent from the description, or may be learned by practice of the presented embodiments.

According to one or more embodiments, a gas flow control device is provided. The gas flow control device may include: a plate including a gas inlet port and extending from the gas inlet port; and a sidewall protruding from the plate and including a plurality of holes formed therethrough. Optionally, the plate may include an insulative material.

According to an embodiment, in the gas flow control device, a space concave from the sidewall may be formed by the plate and the sidewall, and a gas discharge path space may be defined from the plurality of holes to the concave space.

According to one or more embodiments, a showerhead assembly is provided. The showerhead assembly may include: the gas flow control device; and a showerhead member connected to the gas inlet port from a bottom side of the plate.

According to an embodiment, the showerhead assembly may include a gas channel and a showerhead, and the gas channel may be positioned between the gas inlet port and the showerhead and connected to the showerhead by mechanical connectors.

According to another embodiment, in the showerhead assembly, a gas flow path may be formed between the gas channel and the showerhead. In addition, a gas inlet path (refer to a center region of the gas channel 307 in the accompanying drawings) connecting the gas inlet port of the gas flow control device to the gas flow path may be formed.

According to one or more embodiments, a semiconductor manufacturing apparatus (such as a reaction chamber) includes: a reactor wall; a gas flow control device, a showerhead member, and a susceptor. A gas inlet and a gas outlet are provided on an upper portion of the reactor wall, and the gas inlet is connected to a gas inlet port formed through center portions of the reactor wall, the gas flow control device and the showerhead member so as to supply reaction gas to the showerhead member. The gas flow control device includes: a protruding sidewall through which a plurality of penetration holes are formed; and a plate surrounded by the sidewall. A gas discharge path (that is, a gas discharge path space) is formed in a region between the gas flow control device and the reactor wall and a region between a sidewall of the showerhead member and the reactor wall, and reaction gas supplied to a substrate placed on the susceptor through the showerhead member is discharged to the gas outlet provided on the upper portion of the reactor wall through the gas discharge path and the penetration holes formed through the sidewall of the gas flow control device. The gas outlet is asymmetric with the gas inlet port formed through the center portion of the gas flow control device, and the size of the penetration holes and intervals between the penetration holes are varied according to the positions of the penetration holes relative to the gas outlet so as to obtain uniform gas discharge efficiency. In the semiconductor manufacturing apparatus (such as a reaction chamber) of the embodiment, the gas flow control device and the showerhead member are stacked, and grooves are formed in a region between the gas flow control device and the reactor wall and a region between the gas flow control device and the showerhead member to receive sealing members such as O-rings. The reactor wall and the showerhead member are spaced apart from each other to form the gas discharge path. Radio frequency (RF) rods are inserted through other penetration hole formed through the gas flow control device and are connected to the showerhead member so as to supply RF power to the showerhead member during a plasma process.

According to an embodiment, in the semiconductor manufacturing apparatus, the gas inlet and the gas outlet may be connected to a top lid. In addition, the top lid may include a heating element.

According to one or more embodiments, a semiconductor manufacturing apparatus includes: an external chamber including at least two reaction chambers; at least one gas supply unit which the at least two reaction chambers share; and at least one discharge pump configured to discharge gas.

For example, the semiconductor manufacturing apparatus may include: a top lid including at least two gas inlets and at least two gas outlets; and at least two reaction chambers each connected to the top lid in connection with at least one of the gas inlets and at least one of the gas outlets, wherein the reaction chambers share a gas supply unit supplying at least one of raw-material gases and reaction gases and at least one discharge pump.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Characteristics of the inventive concept and implementation methods thereof will be clarified through the following descriptions given with reference to the accompanying drawings. The embodiments may, however, have different forms and should not be construed as being limited to the descriptions set forth herein. Rather, these embodiments are provided so that this disclosure will be thorough and complete, and will fully convey the scope of the inventive concept to those skilled in the art. Therefore, the scope of the inventive concept should be defined by the claims.

Hereinafter, embodiments will be described with reference to the accompanying drawings.

Figure 1:
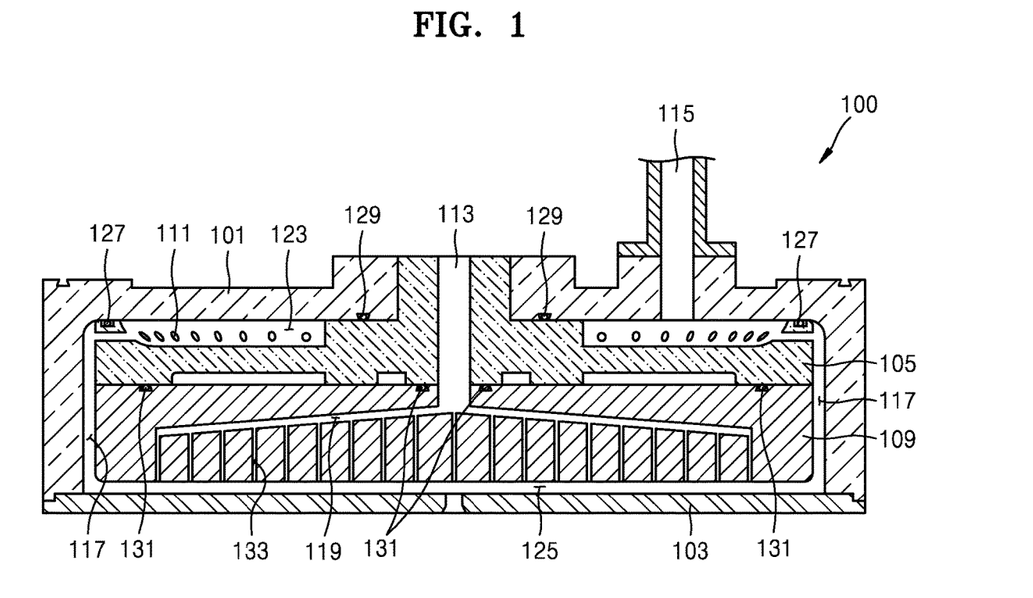
FIG. 1 is a view illustrating a reaction chamber according to an embodiment.

First, a deposition apparatus will now be described according to an embodiment with respect to FIG. 1. FIG. 1 is a cross-sectional view illustrating a reaction chamber 100 according to an embodiment. Referring to FIG. 1, as a reactor wall 101 and a susceptor 103 are brought into contact with each other, a reaction space 125 is formed in the reaction chamber 100. A gas flow control device 105 and a showerhead member (gas injector) 109 are disposed between the upper portion of the reactor wall 101 and the susceptor 103. The showerhead member 109 may be a one-piece member or may be a multi-piece member including a separate part in which gas injection holes 133 are formed. The gas flow control device 105 and the showerhead member 109 are stacked, and the gas flow control device 105 includes a sidewall 123 in which a plurality of penetration holes 111 are formed. Grooves 127, 129, and 131 are formed in a region between the reactor wall 101 and the gas flow control device 105 and a region between the gas flow control device 105 and the showerhead member 109 so as to receive sealing members such as O-rings. Owing to vacuum sealing by the sealing members, external gases may not permeate into the reaction chamber 100, or reaction gases in the reaction space 125 or gases remaining in gas discharge paths may not leak to unintended regions.

The showerhead member 109 may be used as an electrode during a plasma process. To this end, the showerhead member 109 may include a metallic material such as aluminum (Al). In addition, radio frequency (RF) rods 713 (refer to FIG. 7B) are mechanically connected to the showerhead member 109 through RF rod holes 303 (refer to FIG. 3A) formed through an upper portion of the reactor wall 101 and the gas flow control device 105, so as to supply plasma generated by an external plasma generator (not shown) to the showerhead member 109. In addition, the gas flow control device 105 may include an insulative material such as a ceramic material so as to insulate the showerhead member 109, used as a plasma electrode, from the reactor wall 101. As shown in FIG. 1, a gas inlet port 113 is formed through the upper portion of the reactor wall 101 and a center portion of the gas flow control device 105, and a gas flow path 119 is additionally formed in the showerhead member 109. Thus, reaction gas supplied from an external gas supply unit (not shown) through the gas inlet port 113 is uniformly distributed to the gas injection holes 133 of the showerhead member 109. In addition, as shown in FIG. 1, a gas outlet 115 is provided at the upper portion of the reactor wall 101 in an asymmetric relationship with the gas inlet port 113. However, the gas outlet 115 and the gas inlet port 113 may be symmetrically arranged (not shown). In addition, the reactor wall 101 is spaced apart from sidewalls of the gas flow control device 105 and the showerhead member 109, and thus a gas discharge path 117 may be formed therebetween. After a process is performed, remaining gas may be discharged through the gas discharge path 117.

Figure 2:
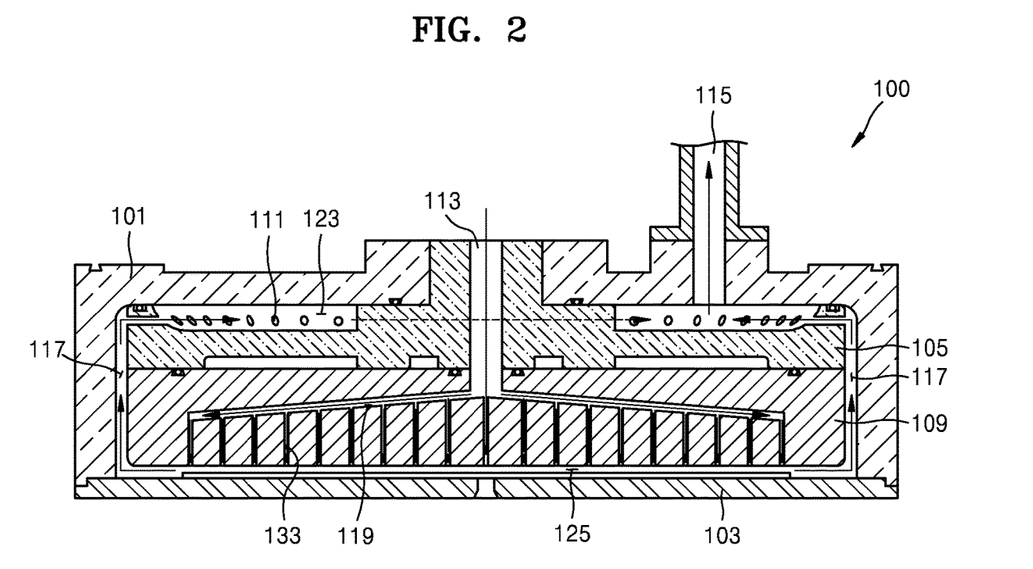
FIG. 2 is a view illustrating how reaction gas flows in the reaction chamber according to an embodiment.

FIG. 2 is a view illustrating how reaction gas flows in the reaction chamber 100 according to an embodiment. In FIG. 2, arrows indicate gas flows. Reaction gas supplied from the external gas supply unit (not shown) to the gas inlet port 113 may uniformly flow to the gas injection holes 133 of the showerhead member 109 through the gas flow path 119. The reaction gas may undergo a chemical reaction in the reaction space 125 or on a substrate (not shown) to form a thin film on the substrate. After a thin film is formed, remaining gas may flow to an internal space of the gas flow control device 105 after passing through the gas discharge path 117 formed between the reactor wall 101 and the sidewall of the showerhead member 109 and passing through the penetration holes 111 formed in the sidewall 123 of the gas flow control device 105, and then the remaining gas may be discharged through the gas outlet 115.

Hereinafter, each part of the reaction chamber 100 will be described with reference to FIGS. 3A and 3B.

Figure 3A:
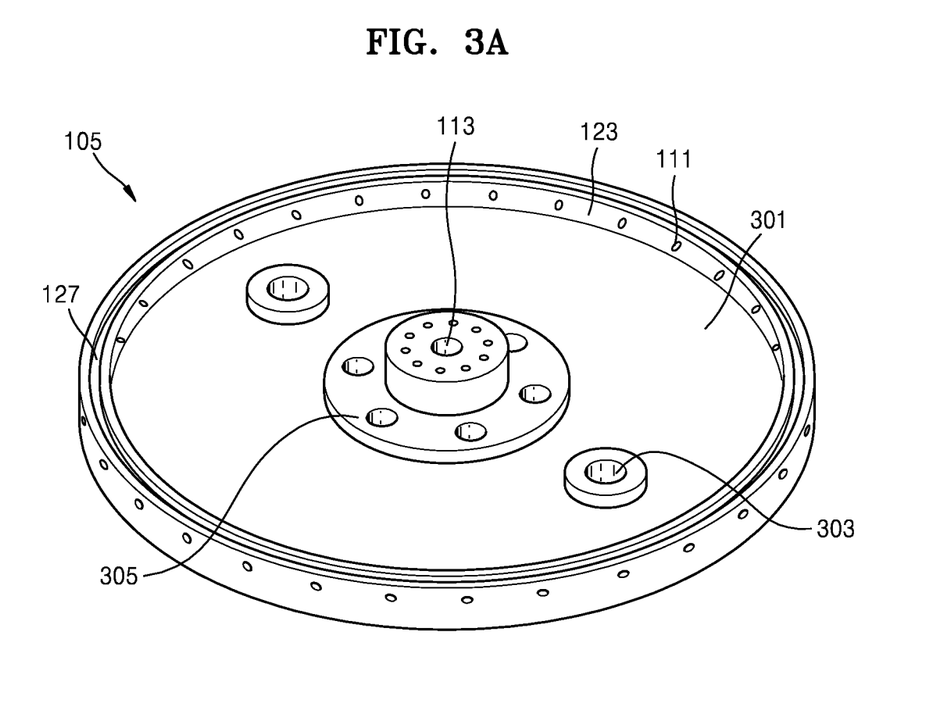
FIG. 3A is a perspective view illustrating a gas flow control device according to an embodiment.

FIG. 3A is a perspective view illustrating the gas flow control device 105 according to an embodiment. Referring to FIG. 3A, the gas flow control device 105 includes the sidewall 123, the gas inlet port 113, a plate 301 surrounded by the sidewall 123, the RF rod holes 303, screw holes 305, the penetration holes 111, and the groove 127 accommodating a sealing member such as an O-ring. In FIG. 3A, the plate 301 has a concave inner portion surrounded by the sidewall 123. The gas inlet port 113 is located at a portion of the gas flow control device 105 to introduce external reaction gas, and the screw holes 305, the number of which is at least two, are formed around the gas inlet port 113 to receive mechanical connectors such as screws 715 (refer to FIG. 7B) and thus to connect the gas flow control device 105 and the showerhead member 109 to each other. The RF rod holes 303 are formed in portions of the gas flow control device 105, and thus the RF rods 713 (refer to FIG. 7B) connected to an external plasma supply unit (not shown) may be connected to the showerhead member 109 under the gas flow control device 105 through the RF rod holes 303.

In FIG. 3A, two RF rod holes 303 are formed to improve the uniformity of plasma power in the reaction space 125 by introducing the RF rod to respective holes 303. However, unlike in FIG. 3A, one or more than two RF rods 713 may be used, and RF rod holes 303 corresponding to the RF rods 713 may be formed. Furthermore, referring to FIG. 3A, the RF rod holes 303 are formed between the sidewall 123 and the screw holes 305. However, the inventive concept is not limited thereto. For example, like the screw holes 305, the RF rod holes 303 may be disposed around the gas inlet port 113.

Gas remaining after reacting with a substrate may flow to the plate 301 of the gas flow control device 105 through the gas discharge path 117 and the penetration holes 111 formed in the sidewall 123 of the gas flow control device 105. Then, the gas may flow across an internal space of the plate 301 toward the gas outlet 115 where the gas may be discharged to the outside. A sealing member such as an O-ring is inserted into the groove 127 formed in an upper side of the sidewall 123 for vacuum sealing between the reactor wall 101 and the gas flow control device 105, and thus gas remaining in the gas discharge path 117 may be introduced into the plate 301 of the gas flow control device 105 only through the penetration holes 111. Furthermore, although not illustrated in FIG. 3A, other grooves 717 and 721 (refer to FIG. 7B) may be formed in a region between an upper end of the reactor wall 101 and the RF rod holes 303 and a region between the upper end of the reactor wall 101 and the screw holes 305, so as to receive sealing members such as O-rings. Therefore, vacuum sealing may be provided to prevent remaining gas from leaking to the outside through unintended paths.

Figure 3B:
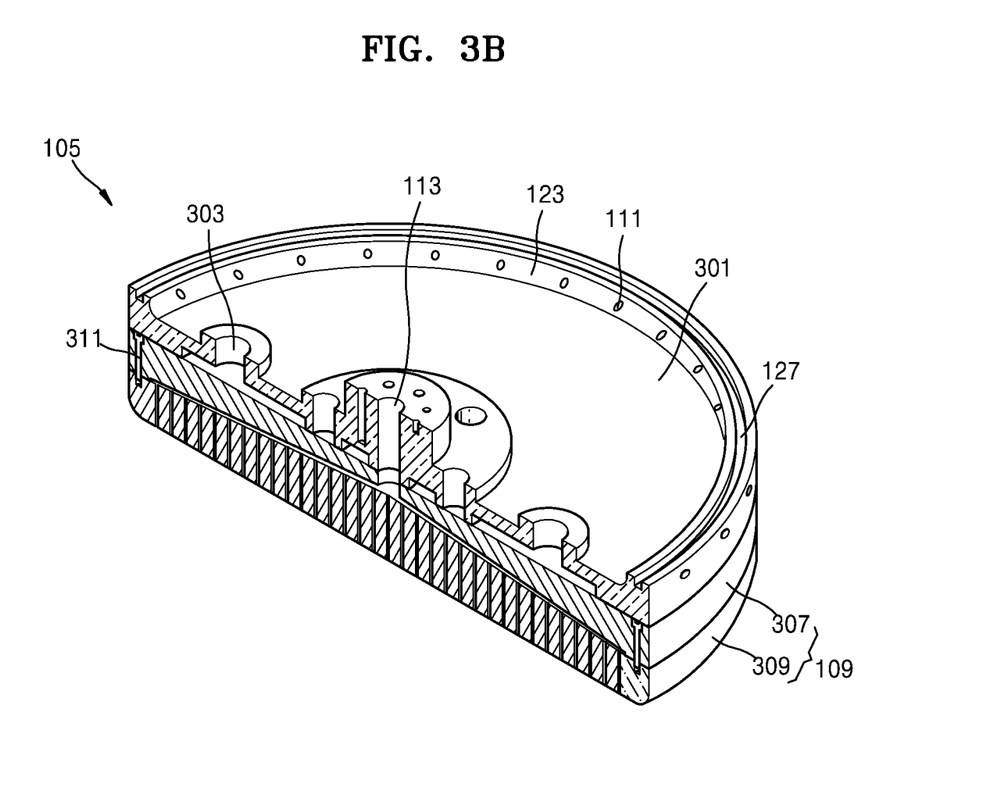
FIG. 3B is a cross-sectional view illustrating an assembled structure of the gas flow control device and a showerhead member according to an embodiment.

FIG. 3B is a cross-sectional view illustrating a showerhead assembly formed by stacking the gas flow control device 105 and the showerhead member 109 together. Referring to FIG. 3B, the showerhead member 109 is a multi-piece member in which a gas channel 307 and a showerhead 309 are stacked together. The gas channel 307 and the showerhead 309 are connected using mechanical connectors such as screws 311. If the showerhead member 109 is used as an electrode during a plasma process, the showerhead 309 may include a metallic material. In addition, the RF rods 713 (refer to FIG. 7B) may be mechanically connected to the gas channel 307 through the RF rod holes 303 (refer to FIG. 7B).

Figure 4A:
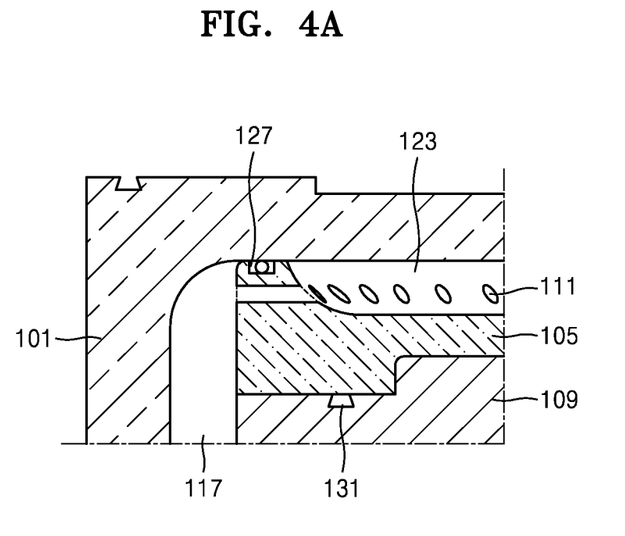
FIG. 4A is a partial cross-sectional view illustrating the reaction chamber according to an embodiment.
Figure 4B:
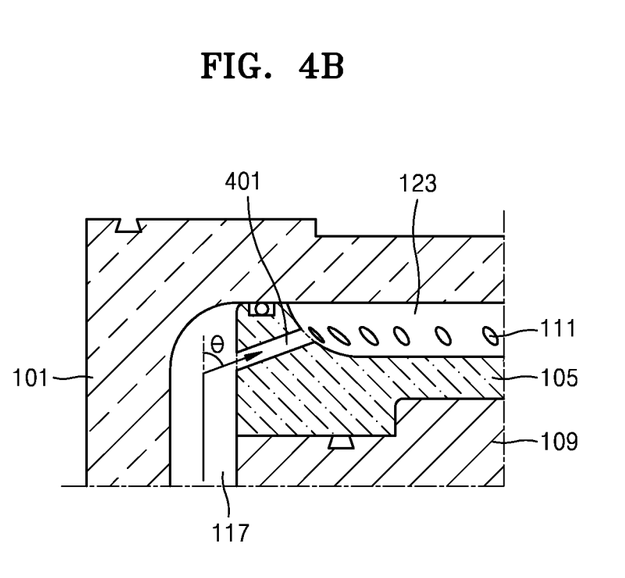
FIG. 4B is a partial cross-sectional view illustrating the reaction chamber according to another embodiment.
Figure 4C:
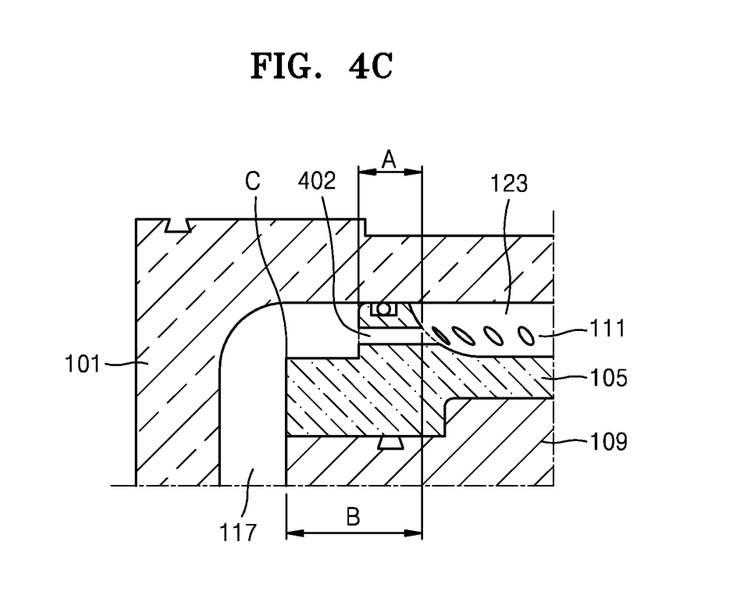
FIG. 4C is a partial cross-sectional view illustrating the reaction chamber according to another embodiment.

FIGS. 4A, 4B, and 4C are partial cross-sectional views illustrating the reaction chamber 100 according to embodiments. Referring to FIG. 4A, the reactor wall 101 and the showerhead member 109 are spaced apart from each other to form the gas discharge path 117, and the penetration holes 111 are formed in the sidewall 123 of the gas flow control device 105. The grooves 127 and 131 are formed in an upper portion of the sidewall 123 making contact with the reactor wall 101 and a contact portion of the showerhead member 109, and thus sealing members such as O-rings may be inserted into the grooves 127 and 131 for vacuum sealing. Therefore, gas remaining in the gas discharge path 117 may be introduced into the gas flow control device 105 only through the penetration holes 111. Referring to FIG. 4A, the penetration holes 111 are formed in a direction perpendicular to the gas discharge path 117. However, as illustrated in FIG. 4B, entrances 401 of the penetration holes 111 may be inclined toward the gas discharge path 117. In this case, the angle θ of the entrances 401 of the penetration holes 111 relative to a direction in which remaining gas flows in the gas discharge path 117 may be less than a right angle. Thus, turbulent flow may be reduced around the entrances 401, and accordingly, the decrease of gas discharge efficiency may be prevented. In addition, as illustrated in FIG. 4C, a portion of the sidewall 123, in which the penetration holes 111 are formed, may have a width (A) less than the width (B) of an edge portion of the gas flow control device 105. In this case, remaining gas may flow directly into entrances 402 of the penetration holes 111 without passing through a bent path. Therefore, when remaining gas flows into the penetration holes 111, laminar flow may be maintained around the entrances 402 of the penetration holes 111 without turbulent flow, and thus the remaining gas may be smoothly discharged with high efficiency. Although not shown, the shape of the reactor wall 101 or the gas flow control device 105 may be modified to prevent turbulent flow. For example, an edge portion C (refer to FIG. 4C) of the gas flow control device 105 may be chamfered.

In addition to structures illustrated in the accompanying drawings, various modifications may be made within the scope of the inventive concept. For example, in the embodiments illustrated in FIGS. 4A to 4C, the sidewall 123 protrudes in a direction different from a direction in which the plate 301 extends. However, the sidewall 123 may protrude in the same direction as the direction in which the plate 301 extends. In this case, the penetration holes 111 may be formed through the sidewall 123 in a direction different from the direction in which the plate 301 extends.

Figure 5A:
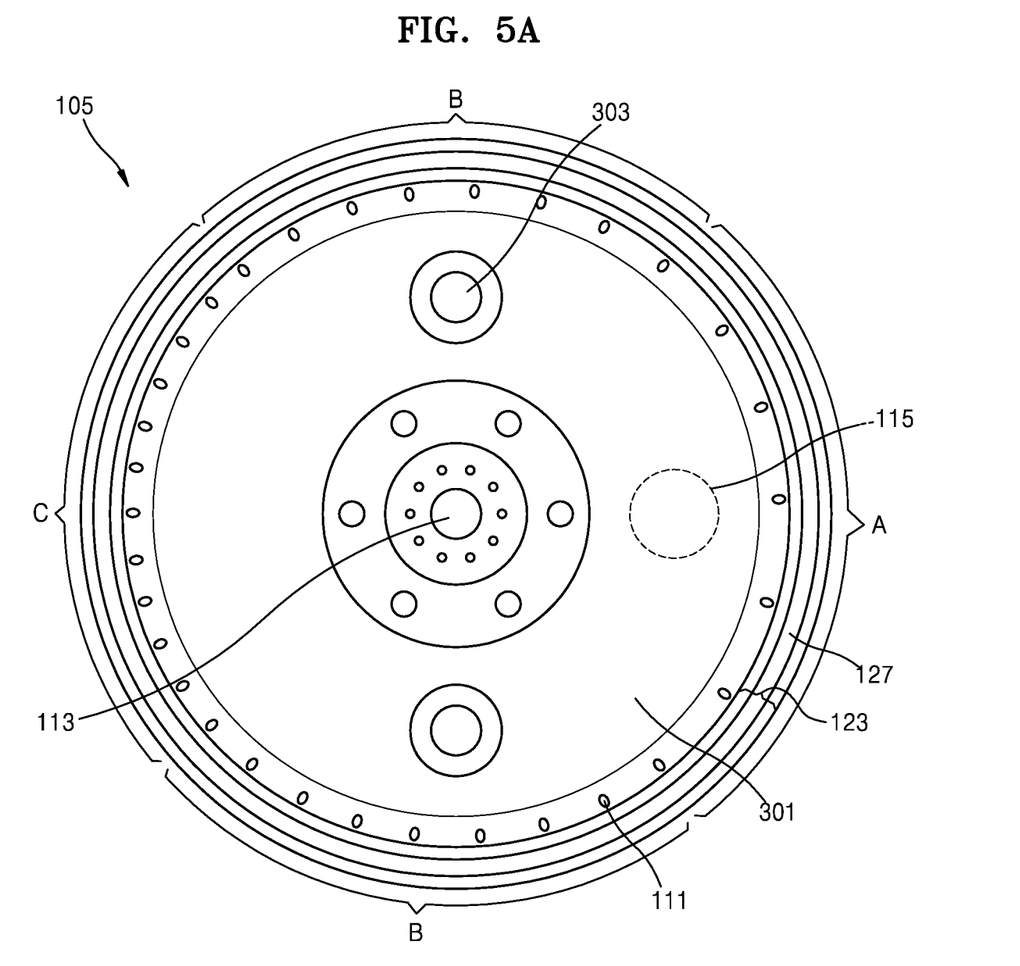
FIG. 5A is a plan view illustrating the gas flow control device according to an embodiment.
Figure 5B:
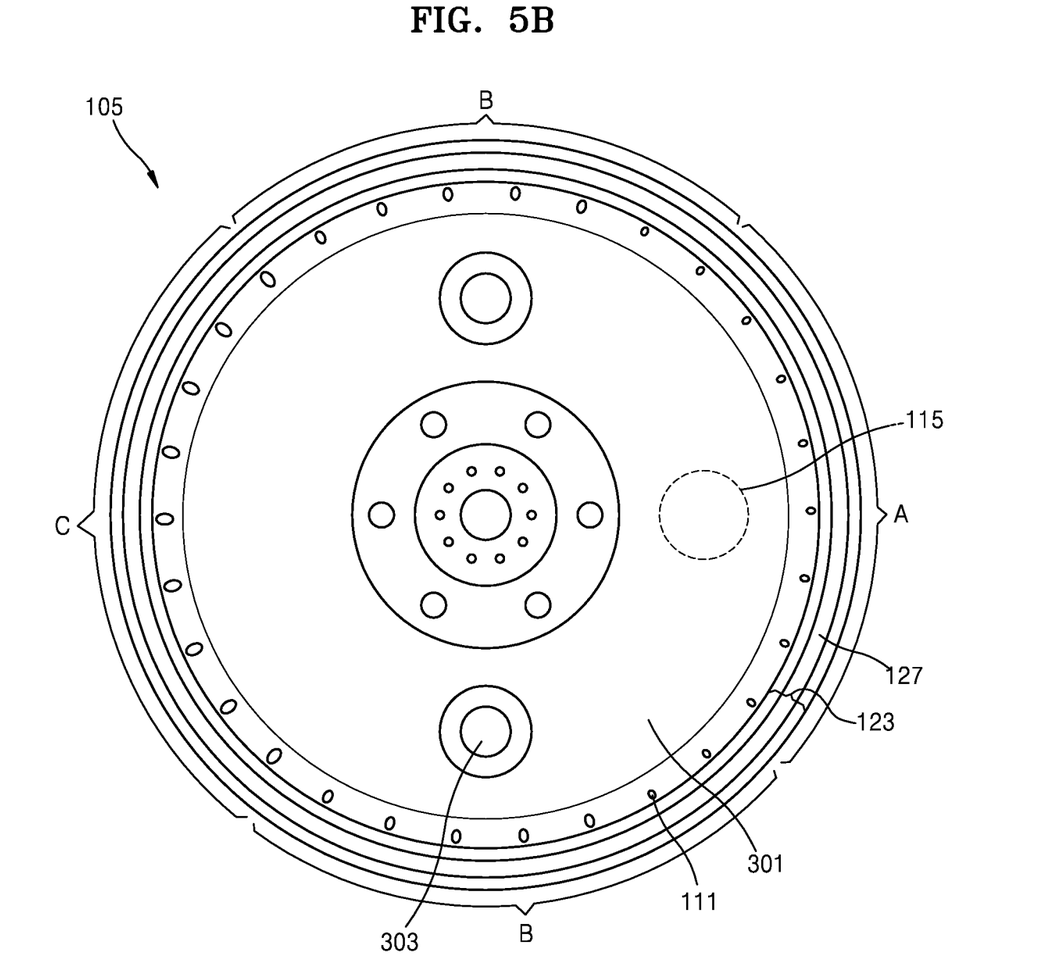
FIG. 5B is a plan view illustrating the gas flow control device according to another embodiment.

FIGS. 5A and 5B are plan views of the gas flow control device 105, illustrating the distribution and size of the penetration holes 111 formed in the sidewall 123 of the gas flow control device 105. Referring to FIG. 5A, the penetration holes 111 have the same size. However, the distance between the penetration holes 111 formed in the sidewall 123 is greater in a region A adjacent to the gas outlet 115 than in regions B and C distant from the gas outlet 115. Referring to FIG. 5A, since penetration holes 111 located in the region C opposite the gas outlet 115 have a relatively low degree of gas discharge efficiency, the penetration holes 111 are densely arranged. However, since penetration holes 111 located in the region A adjacent to the gas outlet 115 have a relatively high degree of gas discharge efficiency, the penetration holes 111 are less densely arranged. Therefore, gas discharge efficiency may be uniform as a whole. Referring to FIG. 5B, although the penetration holes 111 are arranged at regular intervals, the penetration holes 111 have different sizes according to their positions relative to the gas outlet 115. That is, since penetration holes 111 located in the region A adjacent to the gas outlet 115 have a relatively high degree of gas discharge efficiency, the penetration holes 111 have a relatively small size. However, since penetration holes 111 located in the region C opposite the gas outlet 115 have a relatively low degree of gas discharge efficiency, the penetration holes 111 have a relatively large size. Therefore, gas discharge efficiency may be uniform as a whole.

Although one gas outlet 115 is illustrated in FIGS. 5A and 5B, a plurality of gas outlets 115 may be provided. In this case, the gas outlets 115 may be symmetrically or asymmetrically arranged. In addition, as described above, at least one of the size of the penetration holes 111, the shape of the penetration holes 111, and the distance between the penetration holes 111 may be adjusted to obtain uniform gas discharge efficiency. For example, penetration holes 111 relatively adjacent to the gas outlet 115 may have a relatively small size or may be arranged at relatively large intervals, compared to penetration holes 111 relatively distant from the gas outlet 115.

Figure 6:
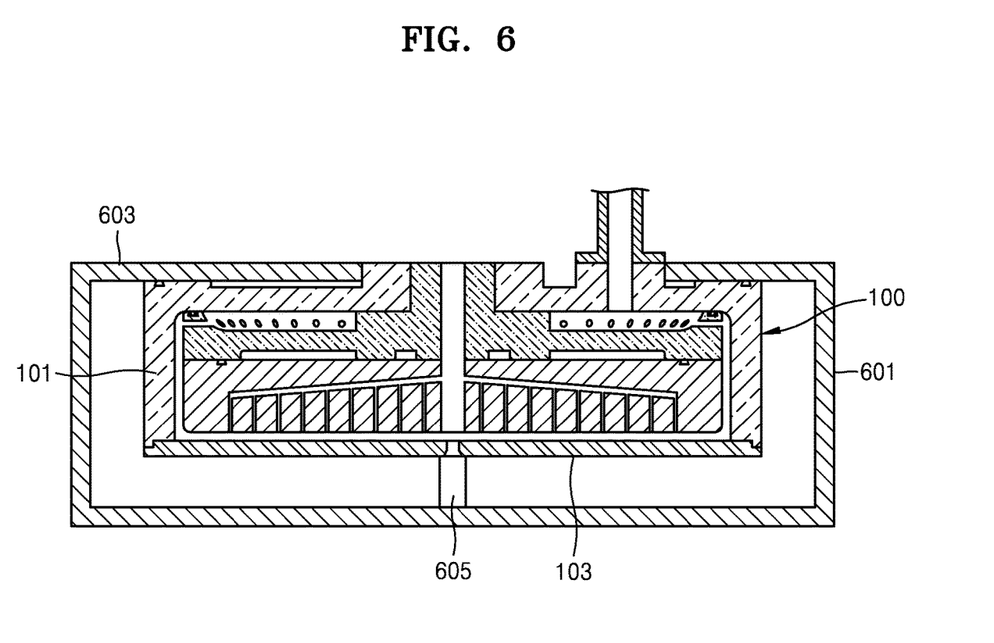
FIG. 6 is a cross-sectional view illustrating a reaction chamber according to another embodiment.

FIG. 6 is a cross-sectional view illustrating a reaction chamber 100 according to another embodiment. FIG. 6 illustrates a dual chamber structure in which the reaction chamber 100 is enclosed by an external chamber 601. The reaction chamber 100 is mechanically fixed to an upper end of the external chamber 601, that is, a top lid of the external chamber 601. The internal pressure of the external chamber 601 may be set to be lower than the internal pressure of the reaction chamber 100, so as to prevent gas such as argon gas filled in the external chamber 601 from permeating into the reaction chamber 100 through a gap between a reactor wall 101 and a susceptor 103. An entrance (not shown, refer to FIG. 8) is formed in a sidewall of the external chamber 601 to transfer a substrate to/from a reaction chamber 1100. The susceptor 103 is supported by a susceptor support 605. The susceptor support 605 includes substrate support pins (not shown). The susceptor support 605 is vertically movable and rotatable. Therefore, when a substrate is loaded/unloaded, the susceptor support 605 is lowered to open a reaction space 125. For example, a substrate is lifted by the substrate support pins (not shown), and a carrier such as a transfer arm is inserted into the external chamber 601 through the entrance (not shown) formed in the sidewall of the external chamber 601 so as to unload the substrate. During a process, the susceptor support 605 is lifted, and at the same time, the substrate support pins on which a substrate is supported are lowered to place the substrate on the susceptor 103. Then, the susceptor 103 is brought into contact with a lower portion of the reactor wall 101, thereby forming the reaction space 125.

Figure 7A:
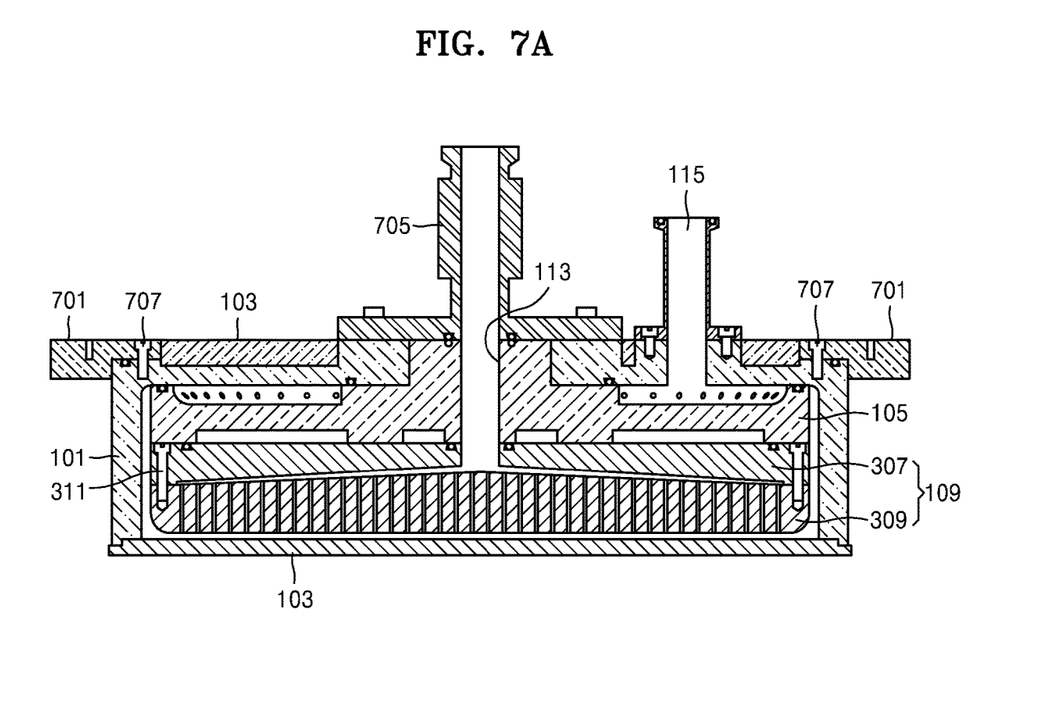
FIG. 7A is a cross-sectional view illustrating a reaction chamber according to another embodiment.
Figure 7B:
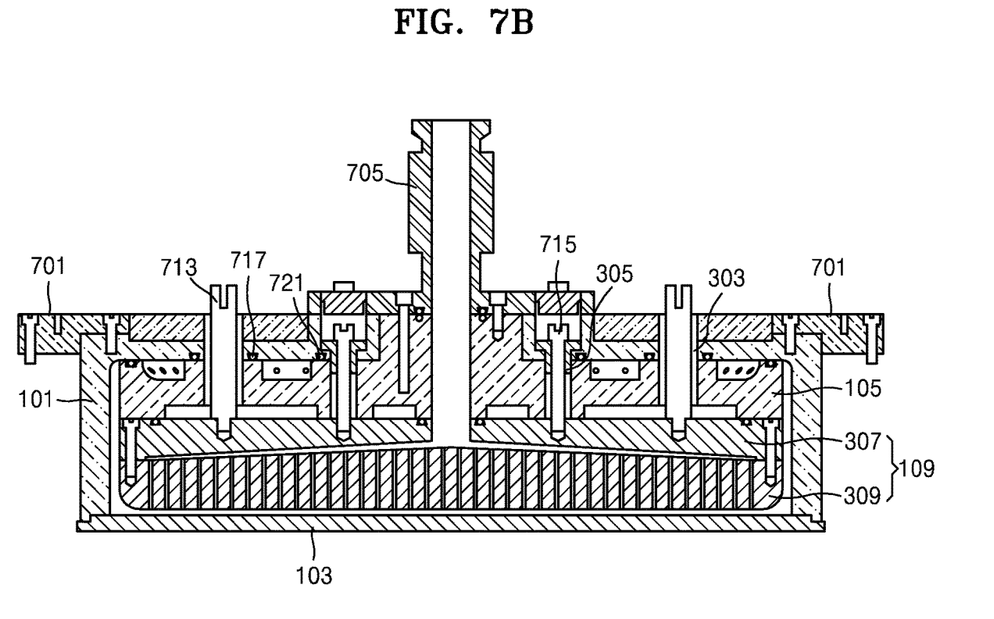
FIG. 7B is another cross-sectional view illustrating the reaction chamber depicted in FIG. 7A from another direction.

FIGS. 7A and 7B are views illustrating a modification of the reaction chamber 100 depicted in FIG. 6, according to another embodiment. Referring to FIG. 7A, a reactor wall 101 of a reaction chamber 100 is connected to a top lid 701 on an upper end of an external chamber by using mechanical connectors such as screws 707. In addition, a heater such as a heating element may be arranged on an upper end of the reactor wall 101 to heat the reactor wall 101. If the reactor wall 101 is heated using the heating element, gas remaining in a gas discharge path 117 or around a gas flow control device 105 may be rapidly heated or converted into a hard film, and thus the remaining gas may not act as a pollutant floating in the reaction chamber 100, and contamination of a reaction space may be prevented. Referring to FIG. 7A, a gas inlet 705 is additionally provided on an upper end of a gas inlet port 113. If a plurality of gas inlet holes (not shown) are formed on the side of the gas inlet 705, gas may be supplied to the reaction chamber 100 in large amounts. In addition, referring to FIG. 7A, unlike the one-piece showerhead member 109 depicted in FIG. 1, a showerhead member 109 formed of multiple separable parts is used. For example, the showerhead member 109 has a stacked structure including a gas channel 307 and a showerhead 309 connected to each other by mechanical connectors such as screws. Since the multi-piece showerhead member 109 has a multi-piece structure, installation, separation, and periodic maintenance of the showerhead 309 may easily be performed.

FIG. 7B is another cross-sectional view illustrating the reaction chamber 100 depicted in FIG. 7A from another direction. Referring to FIG. 7B, the showerhead member 109 is connected to the gas flow control device 105 by a mechanical connectors such as screws 715. Grooves may be formed in a region between a sidewall of the gas flow control device 105 and an upper end of the reactor wall 101, a region between protrusions around RF rod holes 303 and the upper end of the reactor wall 101, and a region between a protrusion around screw holes 305 and the upper end of the reactor wall 101, and sealing members such as O-rings may be inserted into the grooves for vacuum sealing.

Figure 8:
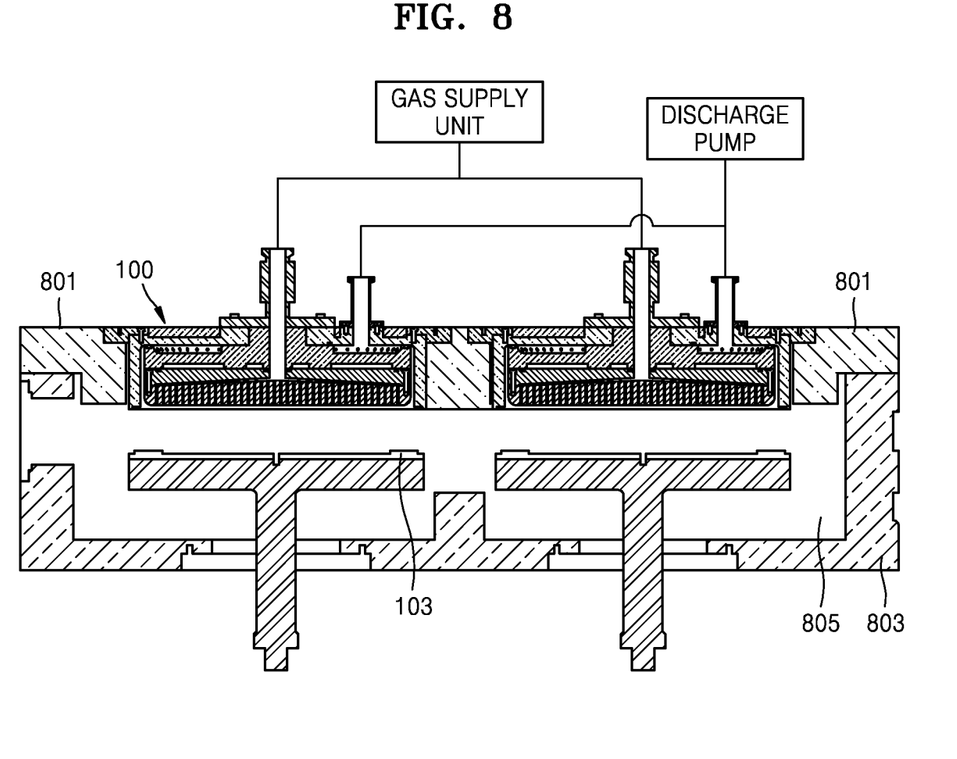
FIG. 8 is a cross-sectional view illustrating reaction chambers according to another embodiment.

FIG. 8 is a cross-sectional view illustrating reaction chambers 100 according to another embodiment. Referring to FIG. 8, a plurality of reaction chambers 100 are disposed in a chamber inner region 805 formed by a top lid 801 and an external chamber 803. A gas flow control device, a showerhead member, a gas inlet port, and a gas outlet of each of the reaction chambers 100 are disposed on the top lid 801. The reaction chambers 100 share the same gas supply unit and the same discharge pump, and thus the same process may be performed on a plurality of substrates at the same time so as to increase productivity.

The same process may be performed on a plurality of substrates at the same time as follows. First, a carrier such as a transfer arm is inserted into the chamber inner region 805 through an entrance of the external chamber 803 so as to load substrates on a plurality of susceptors 103. Thereafter, the chamber inner region 805 of the external chamber 803 is evacuated or filled with an inert gas such as argon gas. Next, the susceptors 103 are brought into contact with lower sides of reactor walls, thereby forming reaction spaces. The pressure of the chamber inner region 805 may be set to be lower than the internal pressure of the reaction chambers 100.

Alternatively, the reaction chambers 100 may not share the gas supply unit and the discharge pump but may be connected to individual gas supply units and discharge pumps so as to perform different processes at the same time. For example, while sequentially moving a substrate to the reaction chambers 100, a composite thin film forming process may be performed to deposit thin films on the substrate. In this case, the composite thin film forming process may be rapidly performed while minimizing exposure to air or waiting time.

As described above, according to the one or more of the above embodiments, reaction gas is uniformly supplied to a substrate in the reaction chamber, and thus a uniform thin film may be formed on the substrate. In addition, since the gas discharge path is formed along an upper portion of the showerhead, unnecessary spaces may be removed to reduce the size of the reaction space. As a result, reaction gases may be rapidly changed from one to another, and contamination caused by remaining gases may be reduced, thereby making it possible to perform an atomic layer deposition process with high productivity and efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A showerhead assembly comprising:
   a gas flow control device comprising:
   a plate comprising a gas inlet port in a center of the plate; and
   a sidewall protruding from the plate and comprising a plurality of holes formed therethrough; and
   a showerhead member comprising:
   a showerhead connected to the gas inlet port from a bottom side of the plate; and
   a gas channel between the gas inlet port and the showerhead,
   wherein the gas inlet port has a diameter larger than each of diameters of the plurality of holes,
   wherein a gas flow path is formed between the gas channel and the showerhead, and
   wherein the showerhead assembly further comprises a gas inlet path connecting the gas inlet port of the gas flow control device to the gas flow path.

2. The showerhead assembly of claim 1, wherein the gas channel is connected to the showerhead by mechanical connectors.

3. The showerhead assembly of claim 2, wherein a fixing hole is formed through the plate to connect the gas flow control device and the showerhead member.

4. The showerhead assembly of claim 3, wherein the fixing hole is disposed between the sidewall and the gas inlet port.

5. The showerhead assembly of claim 4, further comprising a sealing member between the gas flow control device and the gas channel.

6. The showerhead assembly of claim 4, wherein the gas flow control device further comprises at least one screw hole and at least one radio frequency (RF) rod hole that are formed through the plate, and
   the gas flow control device and the gas channel are mechanically connected to each other by connectors provided in the at least one screw hole.

7. The showerhead assembly of claim 1, wherein the gas channel extends in a first direction, and wherein the gas flow path extends in a second direction crossing the first direction.

8. A semiconductor manufacturing apparatus comprising:
   a reactor wall;
   a gas outlet at an upper portion of the reactor wall;
   a plate connected to the reactor wall and comprising a gas inlet port in a center of the plate;
   a sidewall protruding from the plate and comprising a plurality of holes formed therethrough; and
   a showerhead member connected to the gas inlet port from a bottom side of the plate,
   wherein the gas inlet port is formed through the plate, and a gas discharge path is formed in a region between the showerhead member and the reactor wall and a region between the plate and the reactor wall,
   wherein the gas inlet port has a diameter larger than each of diameters of the plurality of holes,
   wherein a space concave from the sidewall is formed by the plate and the sidewall, and
   wherein the space is communicated with the gas outlet.

9. The semiconductor manufacturing apparatus of claim 8, wherein a gas discharge path space is defined from outside of the showerhead member and the plate to the gas outlet through the plurality of holes.

10. The semiconductor manufacturing apparatus of claim 8, wherein the plate comprises an insulative material.

11. The semiconductor manufacturing apparatus of claim 8, wherein the gas outlet and the gas inlet port are asymmetrically arranged,
    the plurality of holes comprise first holes and second holes, and
    at least one of a size of the first holes, a shape of the first holes, and a distance between the first holes is different from that of the second holes.

12. The semiconductor manufacturing apparatus of claim 8, wherein the plurality of holes comprise first holes arranged within a first distance from a gas outlet and second holes distant from the gas outlet by more than the first distance, and
    the first holes are smaller than the second holes or are arranged at intervals greater than intervals between the second holes.

13. The semiconductor manufacturing apparatus of claim 8, further comprising:
    a top lid;
    a chamber housing the plate, the sidewall, and the showerhead member; and
    a susceptor disposed under the showerhead member,
    wherein reaction gas injected form the showerhead member toward the susceptor is discharged through the gas discharge path formed between the showerhead member and the reactor wall, the plurality of holes, and the gas outlet.

14. The semiconductor manufacturing apparatus of claim 13, further comprising a sealing member between the chamber and the sidewall.

15. The semiconductor manufacturing apparatus of claim 13, further comprising a sealing member between the plate and a gas channel, wherein the showerhead member comprises the gas channel and a showerhead.

16. The semiconductor manufacturing apparatus of claim 15, further comprising a gas flow path between the gas channel and the showerhead.

17. The semiconductor manufacturing apparatus of claim 13, wherein the top lid comprises a heating element.

18. The semiconductor manufacturing apparatus of claim 8, wherein the space is disposed directly below the gas outlet.

* * * * *